(12) United States Patent
Shinoda et al.

(10) Patent No.: US 8,415,989 B2
(45) Date of Patent: Apr. 9, 2013

(54) SWITCHING DEVICE FOR ELECTRIC CIRCUIT

(75) Inventors: Akihiro Shinoda, Niiza (JP); Masato Hara, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 186 days.

(21) Appl. No.: 13/074,654

(22) Filed: Mar. 29, 2011

(65) Prior Publication Data
US 2011/0227630 A1 Sep. 22, 2011

Related U.S. Application Data

(63) Continuation-in-part of application No. PCT/JP2009/066125, filed on Sep. 16, 2009.

(30) Foreign Application Priority Data

Sep. 29, 2008 (JP) .................................. 2008-250501

(51) Int. Cl.
*H03K 3/00* (2006.01)

(52) U.S. Cl. .......................... 327/108; 327/112; 326/83

(58) Field of Classification Search .......... 327/108–112; 326/82, 83
See application file for complete search history.

(56) References Cited

U.S. PATENT DOCUMENTS

| | | | |
|---|---|---|---|
| 5,798,666 A * | 8/1998 | Tihanyi ........................ | 327/377 |
| 6,087,877 A * | 7/2000 | Gonda et al. .................. | 327/309 |
| 7,504,868 B2 * | 3/2009 | Bodano et al. ................ | 327/108 |
| 8,242,830 B2 * | 8/2012 | Soma et al. ................... | 327/427 |
| 2005/0168264 A1 | 8/2005 | Fukami | |
| 2008/0170345 A1 | 7/2008 | Tanabe | |

FOREIGN PATENT DOCUMENTS

| | | |
|---|---|---|
| JP | 4-321773 | 11/1992 |
| JP | 7-15009 | 1/1995 |
| JP | 11-32429 | 2/1999 |
| JP | 2005-223399 | 8/2005 |
| JP | 2007-19812 | 1/2007 |
| WO | WO 2008/069145 A1 | 6/2008 |

OTHER PUBLICATIONS

Extended European Search Report Issued Aug. 2, 2012 in Patent Application No. 09816082.3.

* cited by examiner

*Primary Examiner* — Kenneth B. Wells

(74) *Attorney, Agent, or Firm* — Oblon, Spivak, McClelland, Maier & Neustadt, L.L.P.

(57) ABSTRACT

A switching device has a main IGFET having a Schottky barrier diode D3 for blocking an inverse current built therein, a protective switch means, and a protective switch control means. The protective switch means is connected in between a drain electrode D and a gate electrode G of the main IGFET. The protective switch control means turns on the protective switch means when an inverse voltage is impressed to the main IGFET. Thereby, the main IGFET is protected from the inverse voltage.

17 Claims, 12 Drawing Sheets

SWITCHING DEVICE FOR ELECTRIC CIRCUIT

CROSS-REFERENCE TO RELATED APPLICATIONS

This is a continuation-in-part Application of PCT International Application No. PCT/JP2009/066125 (filed Sep. 16, 2009), which is in turn based upon and claims the benefit of priority from Japanese Patent Application No. 2008-250501 (filed Sep. 29, 2008), the entire contents of which are incorporated herein by reference.

BACKGROUND OF THE INVENTION

1. Field of the Invention

The present invention relates to a switching device for an electric circuit, and more specifically relates to a switching device including an insulated-gate field-effect transistor (referred to as IGFET or FET hereinafter) and protective switching means for protecting the same.

2. Description of the Related Art

A typical IGFET has a drain region, a body region (base region), a source region, a drain electrode connected with a drain region, a source electrode connected with the source region and the body region, a gate insulator film covering a surface of the body region exposed between the drain region and the source region, and a gate electrode disposed on the gate insulator film. A source electrode is in ohmic contact with the source region and also in ohmic contact with the body region. Thus there is generated a current path through a channel in the body region between the drain electrode and the source electrode, and another current path through a parasitic diode (a body diode or a inbuilt diode) based on a PN junction between the drain region and the body region. In a case where the IGFET is of a N-channel type, the parasitic diode becomes in an inverse bias state when a potential of the drain electrode is higher than a potential of the source electrode, thus not forming a current path therethrough. However, there may be a case where the potential of the drain electrode is lower than the potential of the source electrode depending on operation of an electric circuit in which the IGFET is used, or misconnection between a power supply (a battery for example) and the electric circuit. In this case, the parasitic diode becomes in a forward bias state, thus causing current flow therethrough. When a current flows via the parasitic diode, a current between the drain and the source cannot be controlled by means of a control voltage between the gate and the source. Further, if a considerable current flows between the drain and the source via the parasitic diode, it gives rise to destruction of the IGFET or the electric circuit.

It is known to couple an external diode (reverse blocking diode) having an inverse polarity (direction) to a polarity (direction) of the parasitic diode in series with the IGFET in order to block a current through the parasitic diode of the IGFET. However, it leads to a power loss to a relatively great extent at the external diode because an identical current to that through the IGFET flows through the external diode. Further, if the external diode is connected in series with the IGFET, control of the current through the IGFET becomes impossible when a potential of the drain electrode is lower than a potential of the source electrode, more specifically when an inverse voltage is applied to the IGFET.

A Japanese Unexamined Patent Publication No. H07-15009 discloses an IGFET of a planar structure in which a source electrode is in Schottky contact with a body region for the purpose of solving the problem raised by an external diode. To have a source electrode being in Schottky contact with a body region as with this case forms a Schottky diode constituted of the source electrode and the body region, thereby the Schottky diode blocking an inverse current.

The IGFET 11 having the Schottky diode built therein has a structure shown in FIG. 3 which has a FET switch Q1 equivalently shown in FIG. 1, first and second PN junction diodes D1 and D2, and the Schottky barrier diode D3. The first PN junction diode D1 has a polarity by which the diode is inversely biased when a potential of a drain electrode D is higher than a potential of a source electrode S, and connected in inverse parallel with the FET switch Q1. The second PN junction diode D2 has an inverse polarity to that of the first PN junction diode D1 and is connected in series with the first PN junction diode D1. The Schottky barrier diode D3 has an inverse polarity to that of the first PN junction diode D1 and is then connected in series with the first PN junction diode D1 and connected in parallel with the second PN junction diode D2. The drain electrode D of the IGFET 11 is connected with a positive terminal 31a of a direct current power supply 31 via a first connection conductor 16, a load 30, and one of the power supply connection conductor 19. The source electrode S is connected with a grounded terminal 31b via a second connection conductor 17 and another of the power supply connection conductor 20.

The gate electrode G of the IGFET 11 is connected with a gate control circuit 32 via a gate resistor 14. Further a bias resistor 15 is connected in between the gate electrode G and the source electrode S. The gate control circuit 32 shown in principle is comprised of a switch 34 and a resistor 35. The switch 34 is constituted of a controllable electronic switch (a transistor for example), one end of which is connected with the gate electrode G of the IGFET 11 via an output conductor 13 and the gate resistor 14 and another end of which is connected with the source electrode S of the IGFET 11. The control terminal of the switch 34 is connected with a control signal input terminal 36 so as to be turned off when the IGFET 11 is turned on and be turned on when the IGFET 11 is turned off. The resistor 35 is connected in between a bias power supply terminal 37 and one end of the switch 34. A bias power circuit 33 connected with the bias power supply terminal 37 is constituted of a direct current bias power supply 38 and a reverse blocking diode 39 and impresses a bias voltage, which can on-drive the IGFET 11, to the gate electrode G via the resistor 35 and the gate resistor 14.

In the meantime, if the positive terminal 31a of the direct current power supply 31 is connected with another of the power supply connection conductor 20 as shown by dotted lines in FIG. 1 and an inverse voltage is impressed to the source electrode S and the drain electrode D so that the source electrode S is made positive and the drain electrode D is made negative, a voltage is impressed to the gate electrode G via the bias resistor 15, thereby reducing a breakdown voltage of the second PN junction diode D2. As a result, the second PN junction diode D2 becomes substantially not functional and thus an inverse directional current is likely to flow through the second PN junction diode D2, thereby giving no benefit by providing the Schottky barrier diode D3. Meanwhile even in a case where the bias resistor 15 is not provided, as a parasitic capacitance exists in between the drain electrode D and the gate electrode G and thus reduction in breakdown voltage of the second PN junction diode D2 occurs, thereby the second PN junction diode D2 becomes substantially not functional.

SUMMARY OF THE INVENTION

An object of the present invention is to achieve electric protection for an insulated-gate field-effect transistor of a type having a Schottky diode built therein, which is included in a switching device.

According to a first aspect of the present invention, a switching device used in an electric circuit is comprised of a main insulated-gate field-effect transistor comprising a drain region of a first conductive type, a body region of a second conductive type disposed on the drain region and having an exposed surface, a source region of the first conductive type formed in the body region and having an exposed surface, a drain electrode in ohmic contact with the drain region, a source electrode in ohmic contact with the source region and in Schottky contact with the body region, a gate insulator layer formed on an exposed surface of the body region between the source region and the drain region, a gate electrode opposed to the exposed surface of the body region via the gate insulator layer; a protective switch having a first end connected with the drain electrode of the main insulated-gate field-effect transistor, a second end connected with the gate electrode of the main insulated-gate field-effect transistor, and a control terminal; and protective switch control means connected with the control terminal of the protective switch and having a function to make the protective switch into an on-state when a voltage is impressed in between the drain electrode and the source electrode in a direction to make the Schottky contact in the main insulated-gate field-effect transistor to be inversely biased.

DETAILED DESCRIPTION OF THE PREFERRED EMBODIMENT

Next, electric circuits accompanying switching devices according to certain embodiments of the present invention will be described hereinafter with reference to FIG. 2-FIG. 13.

1st Embodiment

Figure 1:
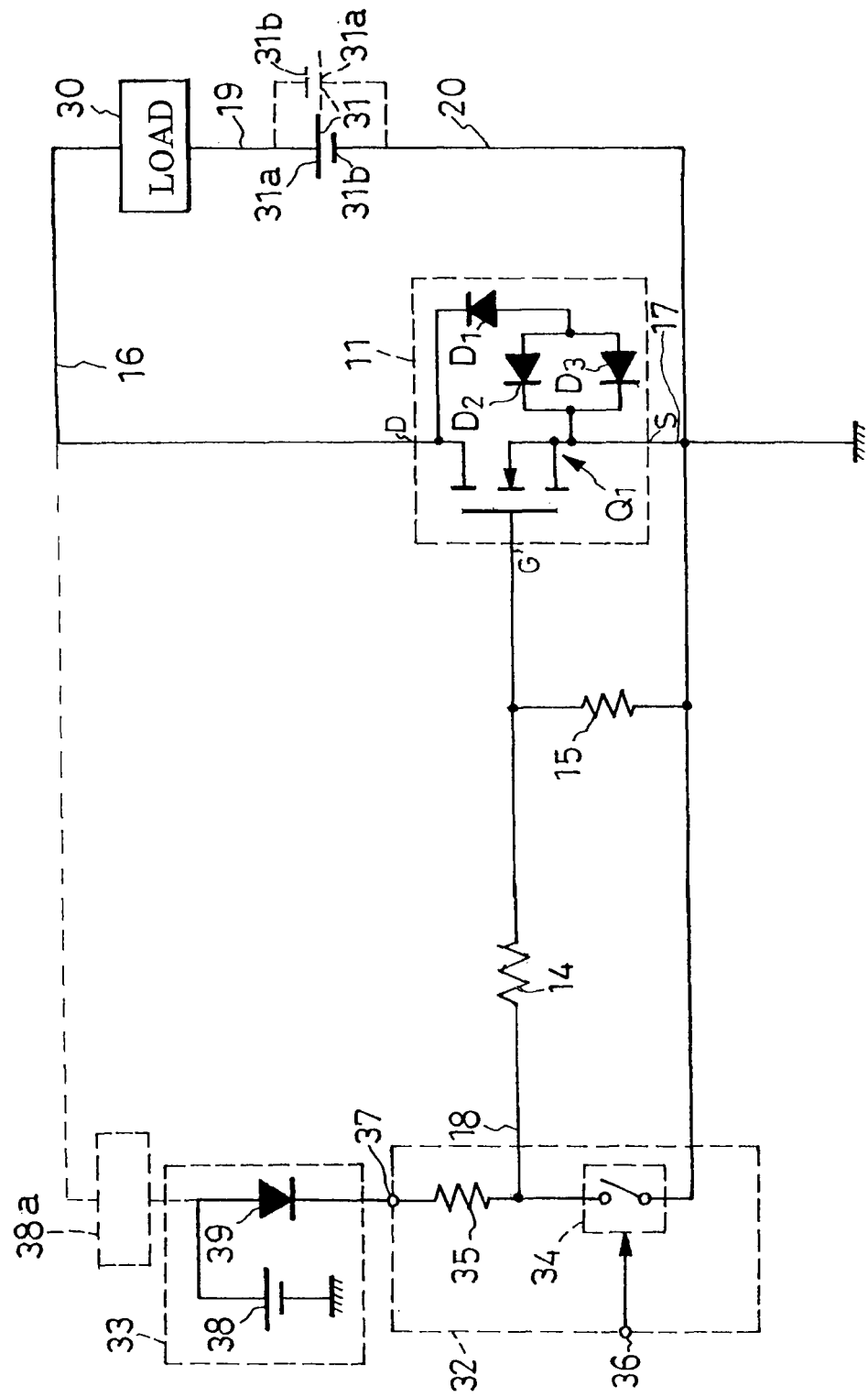
FIG. 1 is a circuit diagram equivalently showing an electric circuit including a switching device of a prior art.
Figure 2:
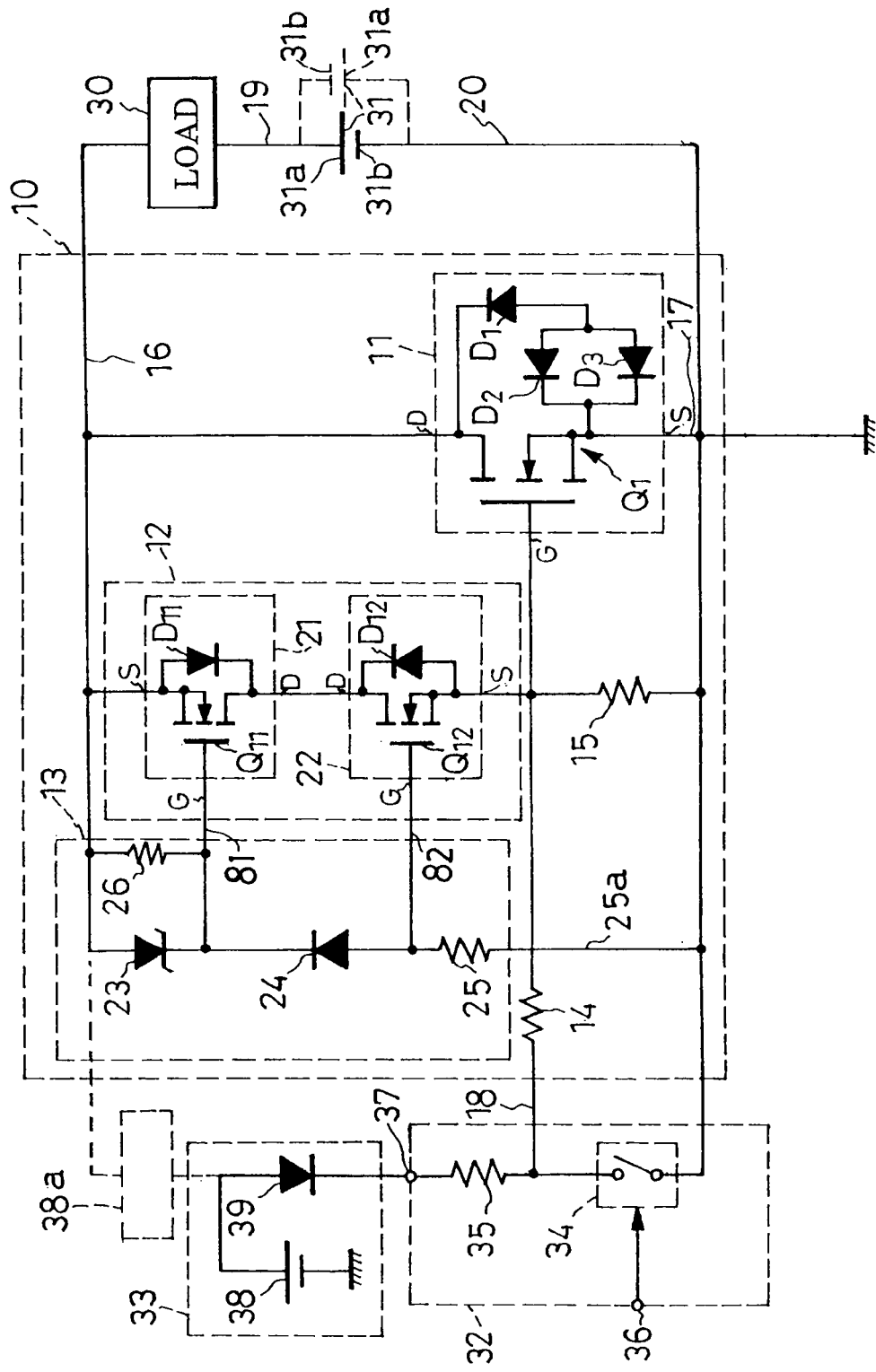
FIG. 2 is a circuit diagram equivalently showing an electric circuit including a switching device according to a 1st embodiment of the present invention.

An electric circuit accompanying a switching device 10 according to a 1st embodiment of the present invention is shown in FIG. 2. The electric circuit is, aside from the switching device 10, comprised of a load 30, a direct current power supply 31 for supplying a direct current power to the load 30, a gate control circuit 32 for on-off-control of the switching device 10, and a bias power supply circuit 33, like as FIG. 1. Meanwhile it is possible to consider the direct current power supply 31, the gate control circuit 32 and the bias power supply circuit 33 as a part of the switching device.

Respective parts of FIG. 1 will be described in more detail.

Figure 3:
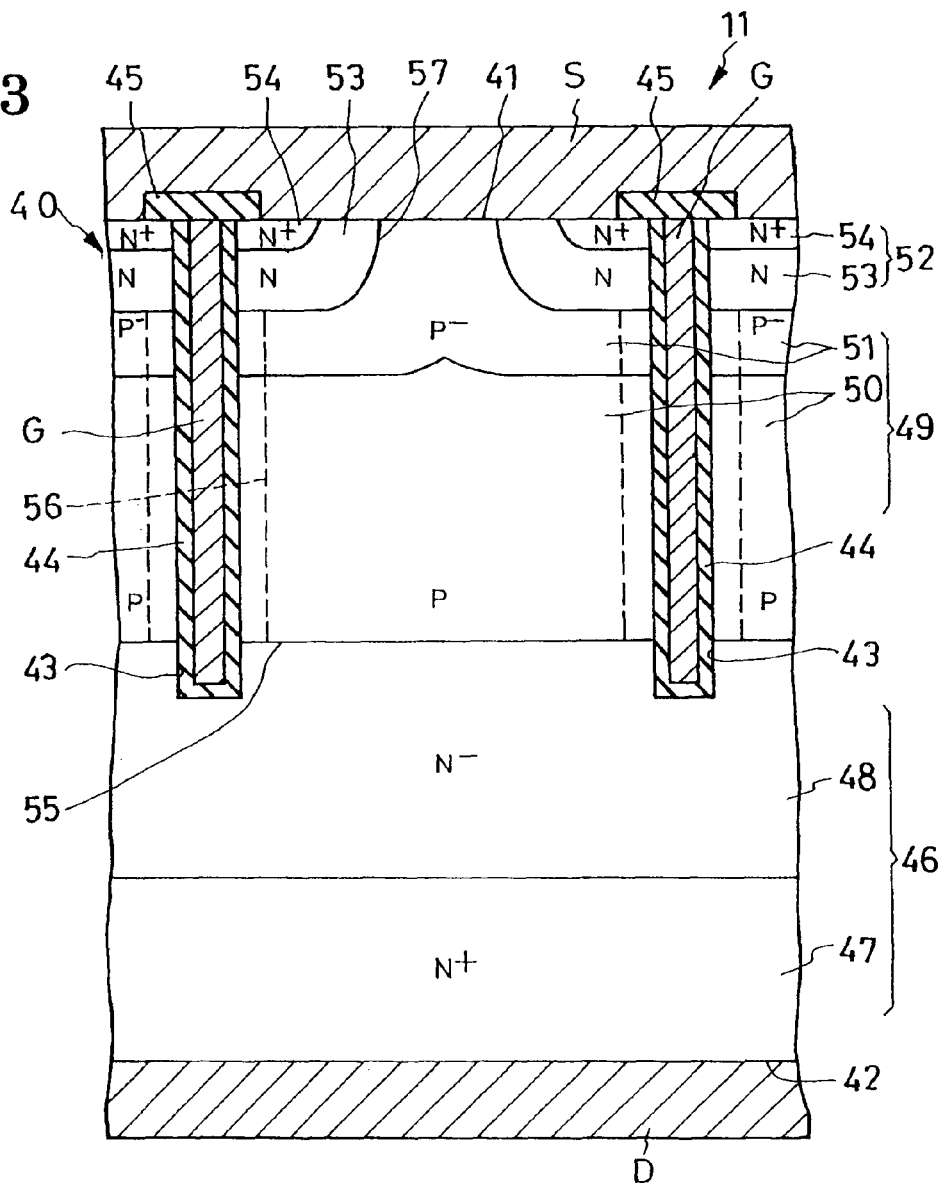
FIG. 3 is a cross sectional view showing the main IGFET of FIG. 2.

The switching device 10 is composed of a semiconductor integrated circuit in general comprised of a main insulated-gate field-effect transistor, which is an IGFET containing a Schottky barrier diode shown in FIG. 3 or has a structure similar thereto, namely a main IGFET 11, a protective switch means 12 for selectively short-circuiting a drain electrode D with a gate electrode G of the main IGFET 11, a protective switch control means 13 for making the protective switch means 12 into an on-state when a voltage is impressed in between the drain electrode D and the source electrode S in a direction to make a Schottky contact in the main IGFET 11, a gate resistor 14, and a bias resistor 15. Next, respective parts of the switching device 10 will be described hereinafter in more detail.

The main IGFET 11 of FIG. 2 has a structure shown in FIG. 3. Before describing the structure of the main IGFET 11, an equivalent circuit and electric connections of the main IGFET 11 will be described on the basis of FIG. 2. When the direct current power supply 31 is normally connected as shown by solid lines, the drain electrode D of the main IGFET is connected with a positive terminal (one end) 31a of the direct current power supply 31 via a first connection conductor 16, the load 30 and a first power supply connection conductor 19, and the source electrode S is connected with a negative terminal, namely a grounded terminal (another end) 31b, via a second connection conductor 17 and a second power supply connection conductor 20. The second connection conductor 17 and the second power supply connection conductor 20 are grounded, thereby functioning as grounded conductors.

The main IGFET 11 includes an FET switch Q1 of an n-channel type connected in between the drain electrode D and the source electrode S, first and second PN junction diodes (parasitic diodes) D1, D2, and a Schottky barrier diode D3. The first PN junction diode D1 can be also referred to as a body diode, a cathode of which is connected with the drain electrode D and an anode of which is connected with respective anodes of the second PN junction diode D2 and the Schottky barrier diode D3. Respective cathodes of the second PN junction diode D2 and the Schottky barrier diode D3 are connected with the source electrode S. Thus the second PN junction diode D2 has an opposite direction relative to the first PN junction diode D1 and is connected with the first PN junction diode D1 in series, and the Schottky barrier diode D3 also has an opposite direction relative to the first PN junction diode D1 and is connected with the first PN junction diode D1 in series. Meanwhile, an output conductor 18 can be also referred to as a gate control input conductor or a terminal. Details of the structure of the main IGFET 11 will be described later.

The gate control circuit 32 is comprised of a switch 34 and a resistor 35. The switch 34 is constituted of a controllable electric switch (a transistor for example). One end thereof is connected with the gate electrode G of the main IGFET 11 via the output conductor 18 and the gate resistor 14, and another end thereof is connected with the source electrode S of the main IGFET 11. A control terminal of the switch 34 is connected with a control signal input terminal 36. The resistor 35 is connected with one end of the switch 34 and the bias power supply terminal 37.

The bias power supply circuit 33 connected with the bias power supply terminal 37 is constituted of a direct current bias power supply 38 and a reverse blocking diode 39, and impresses a bias voltage, which can on-drive the IGFET 11, to the gate electrode G of the main IGFET 11 via the resistor 35 and the gate resistor 14.

While in FIG. 2 the gate control circuit 32 and the bias power supply circuit 33 are schematically shown, the gate control circuit 32 can be replaced by an alternative circuit having a function similar to the circuit of FIG. 2. An amplifier or an inverting amplifier may be connected in between the control signal input terminal 36 of the gate control circuit 32 and the control terminal of the switch for example. Further, it can be shown that either or both of the gate resistor 14 and the bias resistor 15 are included in the gate control circuit 32. Further, it is possible that the direct current bias power supply 38 of the bias power supply circuit 33 is made to be an accumulator battery or a capacitor and a charging circuit 38*a* may be added in between the first connection conductor 16 and the direct current bias power supply 38 as shown by chain lines 38*a* in FIG. 2. Further, the bias power supply circuit 33 may be a booster circuit such as a publicly known booster circuit.

The protective switch means 12 for selectively short-circuiting the drain electrode D with the gate electrode G of the main IGFET 11 is constituted of first and second protective insulated-gate field-effect transistors (respectively referred to as first and second protective IGFETs hereinafter) 21, 22. The first and second protective IGFETs 21, 22 are IGFETs having publicly known structures and respectively have drain electrodes D, source electrodes S and gate electrodes G. More specifically, the first and second protective IGFET 21, 22 have structures corresponding to the main IGFET 11 shown in FIG. 3 but having a second body region 51 with a low P type impurity concentration and a first source region 53 with a low N type impurity concentration omitted. The first protective IGFET 21 is in FIG. 2 equivalently shown by an FET switch Q11 of an n-channel type and a publicly known body diode (parasitic diode) D11, and the second protective IGFET 22 is equivalently shown by an FET switch Q12 of an n-channel type and a publicly known body diode (parasitic diode) D12. An anode of the body diode D11 is connected with a source of the FET switch Q11, and a cathode thereof is connected with a drain thereof. An anode of the body diode D12 is connected with a source of the FET switch Q12, and a cathode thereof is connected with a drain thereof. The source electrode S of the first protective IGFET 21 is one end of the protective switch means 12 and is connected with the drain electrode of the main IGFET 11. The drain electrode D of the first protective IGFET 21 is connected with the drain electrode of the second protective IGFET 22. The source electrode S of the second protective IGFET 22 is another end of the protective switch means 12 and is connected with the gate electrode G of the main IGFET 11.

The protective switch control means 13 is what makes the protective switch means 12 into an on-state when a voltage is impressed in between the drain electrode D and the source electrode S of the main IGFET 11 in a direction to make the Schottky contact in the main IGFET 11 to be inversely biased, more specifically the direct current power supply 31 is erroneously inversely connected as shown by dotted lines in FIG. 2. The protective switch control means 13 is composed of a constant voltage diode (Zener diode for example) connected in between the source electrode S and the gate electrode G of the first protective IGFET 21 via a conductor 81, a reverse blocking diode 24 connected in between the gate electrode G of the first protective IGFET 21 and the gate electrode G of the second protective IGFET 22 via the conductor 81 and a conductor 82, a current limiting resistor 25 connected in between the gate electrode G of the second protective IGFET 22 and the source electrode S of the main IGFET 11 via the conductor 82 and a conductor 25*a*, and a bias resistor 26 connected with the constant voltage diode 23 in parallel. The gate electrodes G of the first and second protective IGFETs 21, 22 function as a control terminal of the protective switch means 12.

Details of operations of the main IGFET 11, the protective switch means 12 and the protective switch control means 13 will be described later.

FIG. 3 is a cross sectional view showing the main IGFET 11 shown in FIG. 2 in detail. The main IGFET 11 is an IGFET of a trench structure. Accordingly, a silicon semiconductor substrate 40, which can be also referred to as a semiconductor substrate constituting the main IGFET 11, has trenches 43 extending from its first principal surface toward its second principal surface 42. The source electrode S is disposed on the first principal surface 41 of the semiconductor substrate 40, the drain electrode D is disposed on the second principal surface 42 of the semiconductor substrate 40, and the gate electrode G is disposed in each trench 43 and opposed to a wall surface of each trench 43 with a gate insulator layer 44 interposed therebetween. The gate electrode G is electrically separated from the source electrode S by an insulator layer disposed on each trench 43 and is connected with a wiring conductor not shown in FIG. 3.

The semiconductor substrate 40 is in general composed of a drain region 46, a body region 49 and a source region 52. The drain region 46 is composed of a first drain region 47 of an N+ type semiconductor with a high impurity concentration and a second drain region 48 of an N− type semiconductor with an impurity concentration lower than that of the first drain region 47. The body region 49 is composed of a first body region (base region) 50 of a P type semiconductor and a second body region of a P− type semiconductor with an impurity concentration lower than that of the first body region (base region) 50. The source region 52 is composed of a first source region 53 of an N type semiconductor with a low impurity concentration and a second source region 54 of the N+ type semiconductor with an impurity concentration higher than that of the first source region 53. Next, respective regions of the semiconductor substrate 40 will be described in detail.

The first drain region 47 of the N+ type (first conductive type) has a surface exposed on the second principal surface 42 and has a relatively high concentration of an N type impurity ($1 \times 10^{19}$ cm$^{-3}$-$1 \times 10^{20}$ cm$^{-3}$ for example). The second drain region 48 of the N− type is a part also referred to as a drift region, and is disposed adjacent to the first drain region 47, and has a lower impurity concentration ($1 \times 10^{15}$ cm$^{-3}$-$1 \times 10^{17}$ cm$^{-3}$ for example) than the first drain region 47. The second drain region 48 contributes to improvement in breakdown voltage of the IGFET. Carriers in the second drain region 48 having a low impurity concentration are accelerated by an electric field. Thus the second drain region 48 functions in a similar way to high-resistive collector regions of bipolar transistors.

In the present embodiment, by providing the semiconductor substrate of the N− type and diffusing the N type impurity through one of the principal surfaces thereof, the first drain region 47 of the N+ type (first conductive type) is formed. However, the second drain region 48 of the N+ type (first conductivity type) can be also obtained by epitaxially growing an N− type semiconductor in the semiconductor substrate of the N+ type. Meanwhile, the second drain region 48 of the N− type is corresponding to a residual part of the semiconductor substrate of the N− type after formation of respective regions 47, 49, 52.

The trenches 43 extend from the first principal surface 41 of the semiconductor substrate 40 toward the second principal surface 42, and then slightly wedges into the second drain region 48 of the N− type. Depth of the trenches 43 is properly set within a range of from the first principal surface 41 to the second drain region 48 of the N− type, or of from the first principal surface 41 to somewhere between the second drain region 48 of the N− type and the first drain region 47 of the N+ type. Meanwhile, the trenches 43 extend at a right angle to the first and second principal surfaces 41, 42 parallel to each other. In the present embodiment, the semiconductor substrate 40 has the plurality of IGFET cells (micro IGFETs) and the plurality of trenches 43 are provided so as to enclose the plurality of IGFET cells. In FIG. 3, two trenches 43 and one IGFET cell are shown in detail. In the present embodiment, although the trenches 43 are formed by forming the first drain region 47 of the N+ type (first conductive type) and the first body region 50 of a P type (second conductive type) in the semiconductor substrate of the N+ type, and thereafter carrying out publicly known anisotropic etching on the semiconductor substrate, a point of time when the trenches 43 are formed may be arbitrarily modified.

The first body region 50 of the P type can be also referred to as a first base region and is disposed adjacent to the second drain region 48 of the N− type and also adjacent to the trenches 43. A PN junction 55 between the first body region 50 and the second drain region 48 extends in parallel with the first and second principal surfaces 41, 42 of the semiconductor substrate 40. Upon existence of the PN junction 55, the first PN junction diode D1 shown in FIG. 2 is formed. In the present embodiment, as the first body region 50 is formed by diffusing the P type impurity through the first principal surface 41 of the semiconductor substrate 40, the impurity concentration gradually decreases from the side of the first principal surface 41 toward the side of the second principal surface 42. The first body region 50 of the P type has a mean impurity concentration ($1\times10^{16}$ cm$^{-3}$-$1\times10^{17}$ cm$^{-3}$ for example) higher than that in the second drain region 48 of the N− type. Meanwhile the mean concentration of the P type impurity in the first body region 50 is determined in a value so as to generate N type channels 56 shown by dotted lines when a gate voltage is impressed to the gate electrode G. Instead of formation of the first body region of the P type by diffusion, it may be formed by epitaxial growth of a P type semiconductor on the second drain region 48 of the N− type.

The second body region 51 of the P− type can be also referred to as a second base region and is adjacent to the first body region 50 and also adjacent to the trenches 43, and has a surface exposed on the first principal surface 41 of the semiconductor substrate 40. The source electrode S is in Schottky contact with the exposed surface of the second body region 51 of the P− type. Thus they form a Schottky barrier diode (SBD) D3 as shown in FIG. 2. To increase the inverse breakdown voltage of the Schottky barrier diode D3 up to 10V or more, a surface impurity concentration of the second body region 51 is set in a value ($1\times10^{16}$ cm$^{-3}$ or less for example) lower than that of the first body region 50. Meanwhile in the present embodiment, the second body region 51 of the P− type is formed by diffusing the N type impurity in a lower concentration than the P type impurity concentration of the first body region 50 of the P type so as to compensate (cancel) the P type impurity in part by the N type impurity.

The first source region 53 of the N type is adjacent to the second body region 51 of the P− type and also adjacent to the trenches 43, and has a surface exposed on the first principal surface 41 of the semiconductor substrate 40. As the first source region 53 is a region formed by selectively diffusing the N type impurity into the second body region 51 of the P− type, its N type impurity concentration decreases according to a depth of diffusion. A PN junction 57 is formed between the first source region 53 of the N type and the second body region 51 of the P− type. The PN junction 57 provides a second PN junction diode D2 as shown in FIG. 2. The second PN junction diode D2 preferably has an inverse breakdown voltage equal to or greater than that of the Schottky barrier diode D1. Accordingly, an N type impurity concentration in the first source region 53 of the N type is determined to be an enough value ($1\times10^{18}$ cm$^{-3}$-$1\times10^{20}$ cm$^{-3}$ for example) to obtain an inverse breakdown voltage required for the second PN junction diode D2.

The second source region 54 of the N+ type is adjacent to the first source region 53 and also adjacent to the trenches 43, and has a surface exposed on the first principal surface 41 of the semiconductor substrate 40. An N type impurity concentration in the second source region 54 is determined to be a value ($1\times10^{18}$ cm$^{-3}$-$1\times10^{20}$ cm$^{-3}$ for example) higher than that in the first source region 53. The second source region 54 of the N+ type is formed by selectively diffusing the N type impurity into the first source region 53.

The source electrode S of the main IGFET 14 is disposed on the first principal surface 41 and is in ohmic contact with the first and second source regions 53, 54 and also in Schottky contact with the second body region 51 of the P− type. The source electrode S is for example formed of any metal such as Al or Ti, or any silicide. A Schottky contact between the source electrode S and the second body region 51 of the P− type forms a Schottky barrier diode D3 of FIG. 2. In the present embodiment, a part of the source electrode S functions as a cathode of the Schottky barrier diode D3. The second body region 51 of the P− type is low in P type impurity concentration than the first body region 50 of the P type, thereby successfully forming the Schottky barrier diode D3 by the source electrode S and the second body region 51 of the P− type. A part where the second body region 51 of the P− type is exposed on the first principal surface 41 of the semiconductor substrate 40, namely a part where the Schottky barrier diode D3 is formed, is disposed at a substantial midway between two trenches 43, and disposed at an opposite side to the channels 56 relative to the source region 52.

The drain electrode D is for example formed of any metal such as Al or Ti—Ni, and in ohmic contact with the first drain region 47 of the N+ type at the second principal surface 42 of the semiconductor substrate 40.

The gate insulator layer 44 is formed of a silicon oxide layer, and formed at wall faces of the trenches 43. The gate electrode G is formed of a polycrystalline silicon doped with an impurity filled in the trenches 43. As the polycrystalline silicon doped with the impurity has conductivity, it functions as a gate electrode G as with any metal. Of course, the gate electrode G may be formed of any metal instead.

<On-State Operations in a Normal State>

Next operations of electric circuits accompanying the switching device 10 of FIG. 2 will be described hereinafter. When the switching device 10 is normally connected with the direct current power supply 31, the positive terminal 31a of the direct current power supply 31 such as a battery is, as shown by solid lines in FIG. 2, connected with the drain electrode D of the main IGFET 11 via the first power supply connection conductor 19, the load 30 and the first connection conductor 16, and its negative terminal 31b is connected with the source electrode S of the main IGFET 11 via the second power supply connection conductor 20 and the second connection conductor 17. In this normally connection state, when a control signal to turn off the switch 34 is input to the control signal input terminal 36 of the gate control circuit 32, the main IGFET 11 is made into an ON state. More specifically, when the switch 34 of the gate control circuit 32 is OFF, a bias voltage at the bias power supply terminal 37 is impressed to the gate electrode G of the main IGFET 11 via the resistor 35 and the gate resistor 14. In more detail, the bias voltage at the bias power supply terminal 37 is divided at the resistor 35, the gate resistor 14 and the bias resistor 15, then the voltage between terminals of the bias resistor 15 is impressed as a gate voltage between the gate electrode G and the source electrode S, and thereby the main IGFET 11 is made into an ON state (conducting state). More specifically, if a gate control voltage greater than a threshold (Vth) is impressed between the gate electrode G and the source electrode S of the main IGFET 11, channels are formed near the surfaces of the body region 49 exposed to the trenches 43, thereby conducting a drain current through a path of the drain electrode D, the drain region 46, the channels 56, the source region 52 and the source electrode S. Meanwhile the first PN junction diode D1 shown in FIG. 2, which is correspondent to the PN junction 55 between the first body region 50 and the second drain region 48, is inversely biased, thereby being made OFF. Thus a current does not flow through the second PN junction diode D2 and the Schottky barrier diode D3. Meanwhile, the bias resistor 15 may be omitted. In this case, the bias voltage at the bias power supply terminal 37 is impressed to the gate electrode G and the source electrode S of the main IGFET 11.

In the period of the normal ON operation of the main IGFET 11, as a potential at the gate electrode G of the first protective IGFET 21 is equal to a potential at its source electrode S, the first protective IGFET 21 is kept in an OFF state. Further, in the period of the normal ON operation of the main IGFET 11, as the reverse blocking diode 24 is OFF, a potential at the gate electrode G of the second protective IGFET 22 is at the ground potential and therefore lower than a potential at the source electrode S of the second protective IGFET 22, thereby keeping the second protective IGFET 22 in an OFF state. Thus the first and second protective IGFETs 21, 22 do not disturb the ON operation of the main IGFET 11.

<Off-State Operations in a Normal State>

As shown by solid lines in FIG. 2, in a normal connection state where the positive terminal 31a of the direct current power supply 31 such as a battery is connected with the drain electrode D of the main IGFET 11 via the first power supply connection conductor 19, the load 30 and the first connection conductor 16 and its negative terminal 31b is connected with the source electrode S of the main IGFET 11 via the second power supply connection conductor 20 and the second connection conductor 17, when a control signal to turn on the switch 34 is input to the control signal input terminal 36 of the gate control circuit 32, the main IGFET 11 becomes an OFF state. More specifically, when the switch 34 of the gate control circuit 32 is ON, the output conductor 18 of the gate control circuit 32 becomes a ground potential and a potential of the gate electrode G of the main IGFET 11 also becomes the ground potential. Thus a potential which can turn on the main IGFET 11 is not impressed between the gate electrode G and the source electrode S of the main IGFET 11, thereby making the main IGFET 11 into an OFF state (non-conductive state).

<Operations in an Abnormal State>

As shown by dotted lines in FIG. 2, in an abnormal connection state, namely an inverse connection state, where the positive terminal 31a of the direct current power supply 31 such as a battery is connected with the source electrode S of the main IGFET 11 via the second power supply connection conductor 20 and the second connection conductor 17, and its negative terminal 31b is connected with the drain electrode D of the main IGFET 11 via the first power supply connection conductor 19, the load 30 and the first connection conductor 16, the reverse blocking diode 24 is forwardly biased and is thereby conductive. Thereby the potential of the gate electrode G of the first protective IGFET 21 becomes higher than the potential of the source electrode S of the first protective IGFET 21, thereby making the first protective IGFET 21 into an ON state. Further, the body diode D12 of the second protective IGFET 22 is forwardly biased and is thereby conductive. Further, as the potential of the gate electrode G of the second protective IGFET 22 becomes higher than the potential of the drain electrode D of the second protective IGFET 22, the EFT switch Q12 of the second protective IGFET 22 becomes an ON state. As a result, the drain electrode D and the gate electrode G of the main IGFET 22 are short-circuited by means of the protective switch means 12 composed of the first and second protective IGFET 21, 22. Thereby the potential of the gate electrode G of the main IGFET 11 becomes equal to or substantially equal to the potential of the drain electrode D, and the potential of the gate electrode G of the main IGFET 11 is prevented or suppressed from becoming higher than the potential of the second body region 51, thereby preventing or suppressing reduction in breakdown voltage of the second PN junction diode (parasitic diode) D2 formed on the basis of the PN junction between the second body region 51 and the first source region 53. Therefore an inverse current which may pass through the second PN junction diode (parasitic diode) D2 when an inverse voltage is impressed to the main IGFET 11 is suppressed and therefore the main IGFET 11 or the load 30 can be protected from the inverse current.

In a case where the switch 34 of the gate control circuit 32 is ON in the abnormal operation (the operation when the power supply is abnormally connected), a current flows through the switch 34, the gate resistor 14 and the protective switch means 12 and a current flows through the bias resistor 15 and the protective switch means 12. However, to set resistances of the gate resistor 14 and the bias resistor 15 in high values, the current through the protective switch means 12 can be suppressed. It is preferable that the gate resistor 14 is 10 ohms-30 kilohms so as to successfully limit the current through the protective switch means 12 when the inverse voltage is impressed.

The 1st embodiment provides the following effects.

(1) The main IGFET 11 has the Schottky barrier diode D3 and the second PN junction diode (parasitic diode) D2 built-in as well as the first PN junction diode D1 equivalently shown in FIG. 2. If the protective switch means 12 is not provided, when an inverse voltage is impressed in between the source electrode S and the drain electrode D in a direction to make the Schottky barrier diode D3 and the second PN junction diode D2 to be inversely biased, the breakdown voltage of the second PN junction diode D2 decreases and thereby the second PN junction diode D2 may lose a reverse blocking function. In contrast, if the protective switch means 12 according to the present invention is provided, when an inverse voltage is impressed in between the drain electrode D and the source electrode S, which may be caused by inverse connection of the direct current power supply 31 for example, the protective switch means 12 becomes into an ON state and the potential of the gate electrode G of the main IGFET 11 becomes equal to or substantially equal to the potential of the drain electrode D. Therefore the potential of the gate electrode G of the main IGFET 11 is prevented or suppressed from becoming higher than the potential of the second body region 51, thereby preventing or suppressing reduction in breakdown voltage of the second PN junction diode (parasitic diode) D2 formed on the basis of the PN junction between the second body region 51 and the first source region 53. As a result, the inverse current which passes through the second PN junction diode D2 when an inverse voltage is impressed to the main IGFET 11 is suppressed and therefore the main IGFET 11 or the load 30 can be protected from the inverse current.

(2) The protective switch means 12 is constituted of a series circuit of the first and second protective IGFETs 21, 22. The publicly known diode D12 built in the second protective IGFET 22 has a function of blocking an inverse current through the protective switch means 12 (reverse blocking function) when the forward voltage is impressed to the main IGFET 11, and a function of forming a short circuit between the drain electrode D and the gate electrode G of the main IGFET 11 when the inverse voltage is impressed to the main IGFET 11. Thus the second protective IGFET 22 can be replaced by an independent reverse blocking diode. However, an internal resistance of the independent reverse blocking diode is higher than an internal resistance of an IGFET. In contrast, in the present embodiment shown in FIG. 2, when the inverse voltage is impressed to the main IGFET 11, the diode D12 built in the second protective IGFET 22 becomes conductive and simultaneously the FET switch of the second protective IGFET 22 is ON-driven. As a result, an ON-resistance (internal resistance at a time of ON) of the second protective IGFET 22 becomes smaller than the independent reverse blocking diode.

(3) The gate electrodes G of the first and second protective IGFETs 21, 22 are mutually connected via the reverse blocking diode 24, and the gate electrode G of the second protective IGFET 22 is connected with the second connection conductor 17 and the second power supply connection conductor 20 as grounded conductors via the resistor 25 and the conductor 25a. Thereby, when an inverse voltage is impressed to the main IGFET 11, the first and second protective IGFETs 21, 22 are simultaneously and automatically ON-driven.

(4) As the constant voltage diode 23 is connected in between the source electrode S and the gate electrode G of the first protective IGFET 21, the source electrode S and the gate electrode G of the first protective IGFET 21 are protected from an overvoltage.

(5) As the device has the gate resistor 14 and the bias resistor 15, when an inverse voltage is impressed to the main IGFET 11, a current through the protective switch means 12 can be limited.

(6) The reverse blocking diode 24 of the protective switch control means 13 bars or limits a current through the protective switch control means 13 when a forward voltage is impressed to the main IGFET 11. Thereby, the switch 10 with small loss can be provided.

2nd Embodiment

Next, an electric circuit comprised of a switch device of the 2nd embodiment will be described hereinafter with reference to FIG. 4. Please note that identical reference numerals will be attached to identical elements in FIGS. 5-13 as compared with FIGS. 2-3 and then detailed descriptions for them will be omitted.

Figure 4:
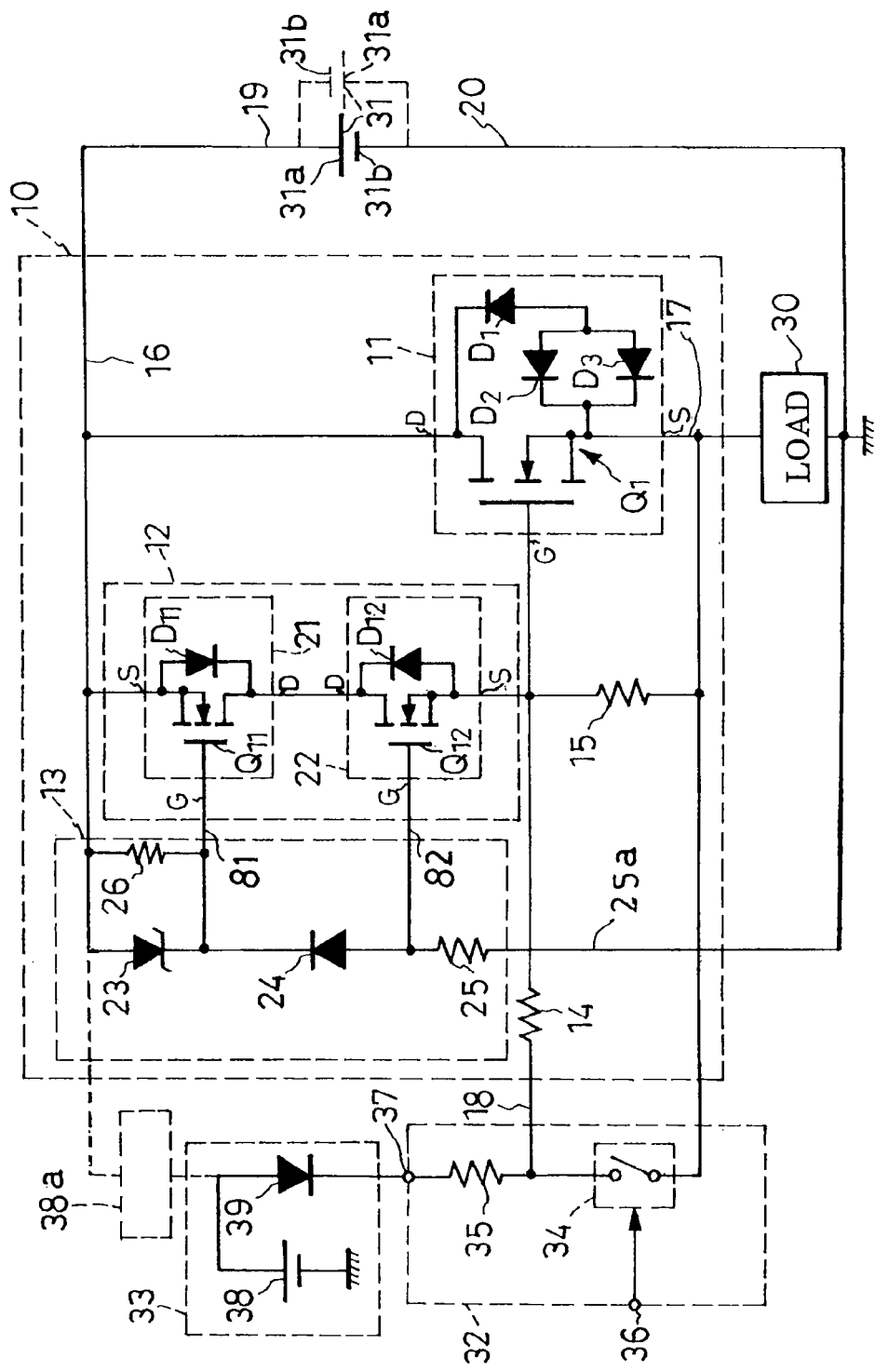
FIG. 4 is a circuit diagram equivalently showing an electric circuit including a switching device according to a 2nd embodiment of the present invention.

The electric circuit comprised of the switch device 10 of the 2nd embodiment as shown in FIG. 4 is formed in a way identical to FIG. 2 aside from points that the load 30 is connected in between the source electrode S of the main IGFET 11 and the second power supply connection conductor (grounded conductor) 20 and a lower end of the resistor 25 of the protective switch control means 13 is connected with the second power supply connection conductor 20. More specifically, one end of the load 30 is connected with the source electrode S of the main IGFET 11 via the second connection conductor 17, and another end thereof is connected with the second power supply connection conductor (grounded conductor) 20. Meanwhile, the second power supply connection conductor (grounded conductor) 20 is connected with the negative terminal 31b of the direct current power supply 31 in an normal connection state.

Even if the connection point of the load 30 is changed in a way as shown in FIG. 4, the electric circuit composed of the switch device 10 of the 2nd embodiment provides similar effects with that of the 1st embodiment.

3rd Embodiment

Figure 5:
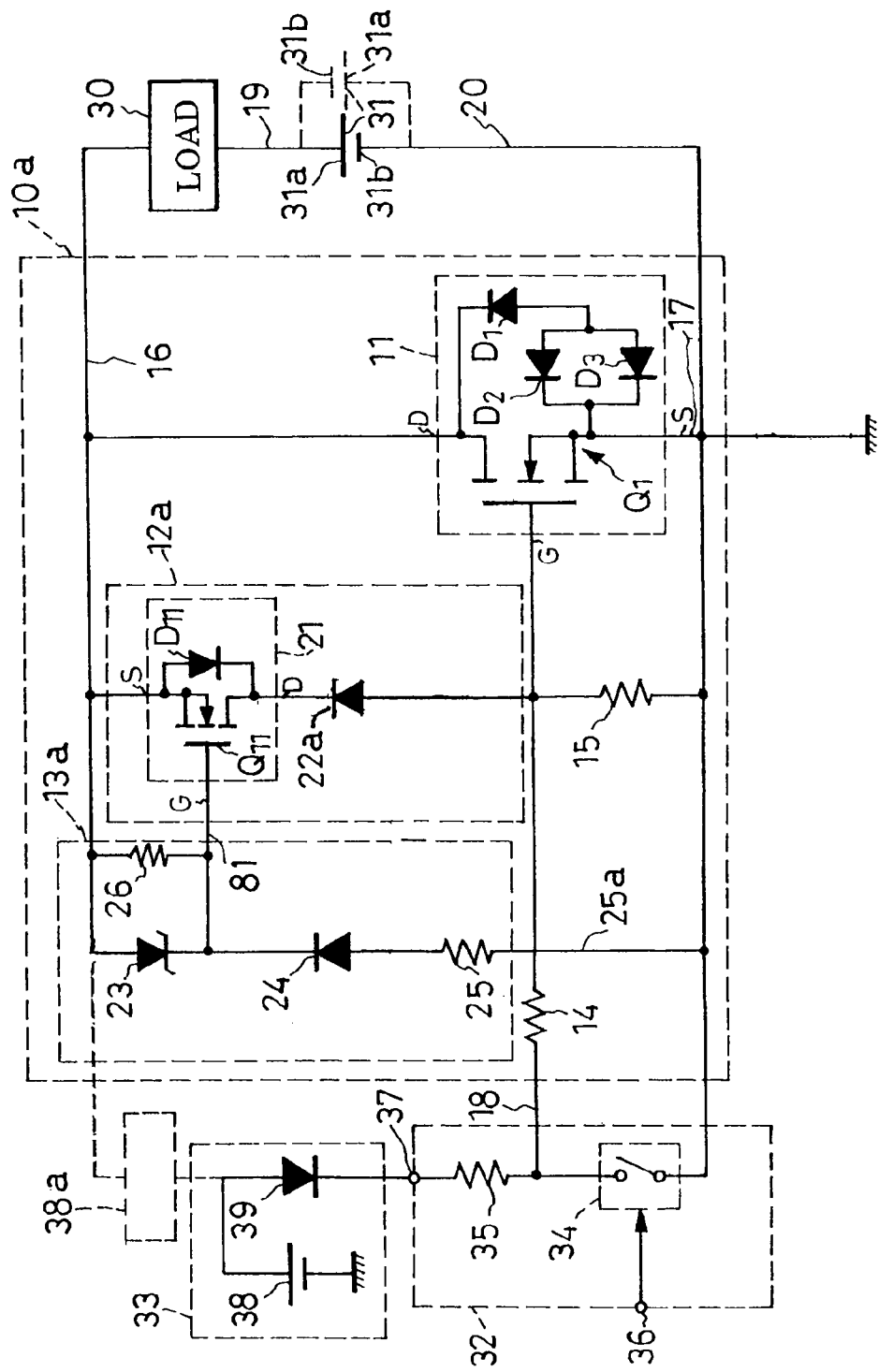
FIG. 5 is a circuit diagram equivalently showing an electric circuit including a switching device according to a 3rd embodiment of the present invention.

The electric circuit comprised of the switch device 10a of the 3rd embodiment as shown in FIG. 5 is formed in a way identical to FIG. 2 aside from points that a modified protective switch means 12a and a modified protective switch control means 13a are provided. The modified protective switch means 12a is constituted in a way identical to the protective switch means 12 of FIG. 2 aside from a point that it has a reverse blocking diode 22a instead of the second protective switch means 12 of FIG. 2. The reverse blocking diode 22a is connected in between the drain electrode D of the protective IGFET 21 and the gate electrode G of the main IGFET 11, and functions in a way similar to the diode D12 built in the second protective IGFET 22 of FIG. 2. The anode electrode of the reverse blocking diode 22a functions as another end of the protective switch means 12a, and is connected with the gate electrode G of the main IGFET 11. The protective switch control means 13a of the 3rd embodiment as shown in FIG. 5 is constituted in a way identical to the protective switch control means 13 of FIG. 2 aside from a point that it does not have any element corresponding to the conductor 82 of FIG. 2.

The 3rd embodiment as shown in FIG. 5 is disadvantageous as compared with the 1st embodiment in a point that the internal resistance of the protective switch means 12a becomes higher than the internal resistance of the protective switch means 12 of FIG. 2, however it is advantageous as compared with the 1st embodiment in a point that the circuit constitution of the protective switch means 12 of FIG. 2 becomes simpler than the protective switch means 12 of FIG. 2. The 3rd embodiment as shown in FIG. 5 provides effect similar to those of the 1st embodiment of FIG. 2.

Meanwhile, in FIG. 5, the connection point of the load 30 may be, as with FIG. 4, moved to a midway between the source electrode S of the main IGFET 11 and the second power supply connection conductor 20 and the lower end of the resistor 25 may be connected with the second power supply connection conductor 20.

4th Embodiment

Figure 6:
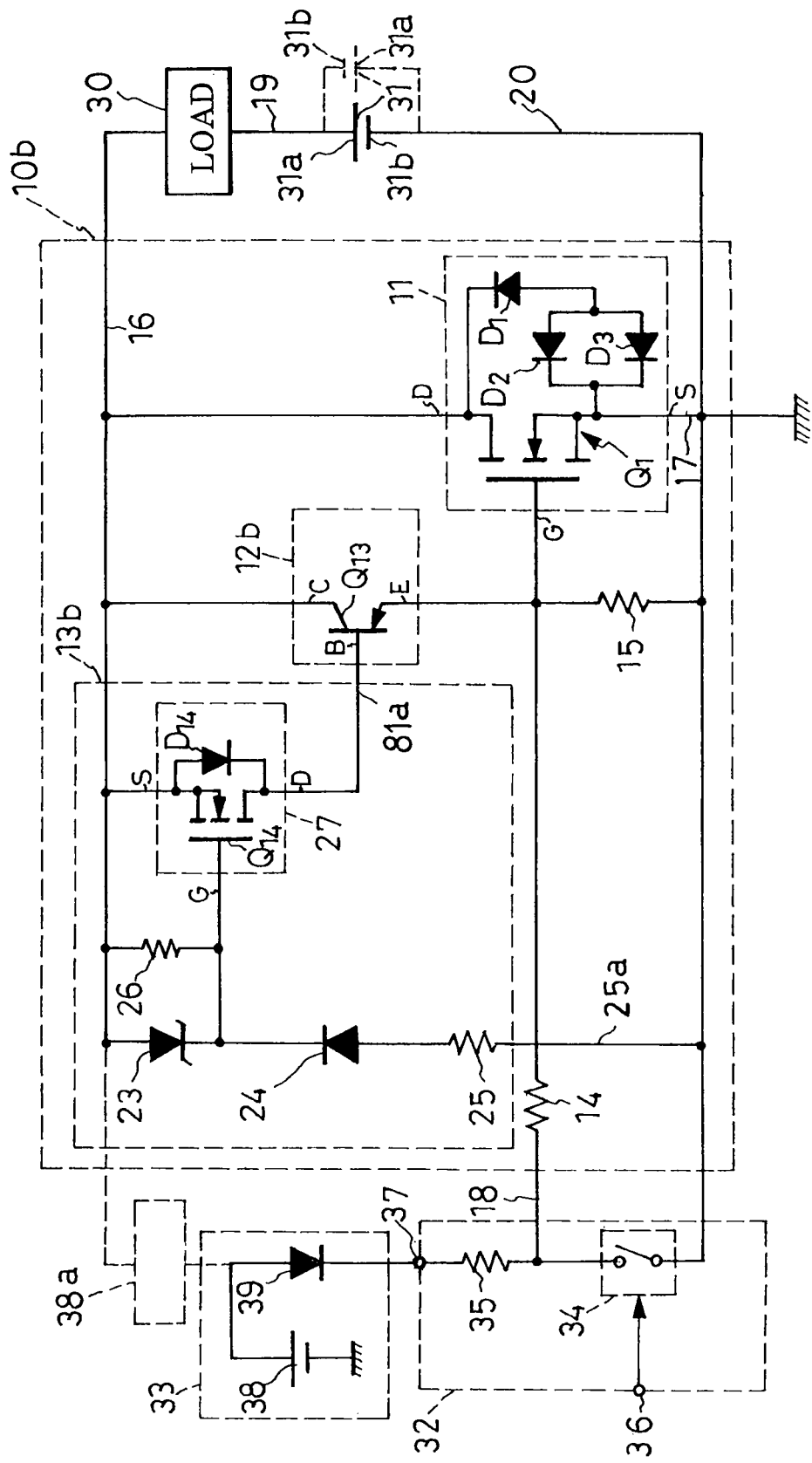
FIG. 6 is a circuit diagram equivalently showing an electric circuit including a switching device according to a 4th embodiment of the present invention.

The electric circuit comprised of the switch device 10b of the 4th embodiment as shown in FIG. 6 is formed in a way identical to FIG. 2 aside from points that a modified protective switch means 12b and a modified protective switch control means 13b are provided. The modified protective switch means 12b is composed of a pnp transistor Q13, which is a kind of junction transistors, connected instead of the first and second protective IGFETs 21, 22 of FIG. 2. A collector C of the pnp transistor Q13 is connected with the drain electrode D of the main IGFET 11, and its base electrode B is connected with the first connection conductor 16 via the IGFET 27 of the modified protective switch means 12b. A collector C of the pnp transistor Q13 functions as one end of the protective switch means 12b, the emitter E functions as another end of the protective switch means 12b, and its base functions as the control terminal of the protective switch means 12b. The protective switch means 12b composed of the pnp transistor Q13 becomes ON when the direct current power supply 31 is connected in an inverse polarity as shown by dotted lines as with FIG. 2.

The modified protective switch control means 13b as shown in FIG. 6 is constituted in a similar way as FIG. 2 but therein the IGFET 27 is added to the protective switch control means 13 of FIG. 2. The IGFET 27 of the protective switch control means 13b of FIG. 6 is constituted in a way similar to the first protective IGFET 21 of the protective switch means 12 of FIG. 2. More specifically, the IGFET 27 of FIG. 6 is an IGFET of a publicly known structure, and has an FET switch Q14 of an n-channel type having a drain electrode D, a source electrode S, and a gate electrode G, and a publicly known body diode (parasitic diode) D14. An anode of the body diode D14 is connected with the source electrode S of the FET switch Q14, and a cathode thereof is connected with the drain electrode D. The source electrode S of the IGFET 27 is connected with the collector C of the pnp transistor Q13 and the first connection conductor 16, the drain electrode D is connected with the base B of the pnp transistor Q13 via the conductor 81a, and the gate electrode G is connected with the second power supply connection conductor 20 at the grounded side via the reverse blocking diode 24 and the resistor 25.

The modified protective switch means 12b of the switch device 10b of the 4th embodiment as shown in FIG. 6 operates in a way similar to the protective switch means 12 of FIG. 2. More specifically, it is controlled into an OFF state when the direct current power supply 31 is normally connected as shown by solid lines, and it is controlled into an ON state when the direct current power supply 31 is inversely connected as shown by dotted lines. Further in detail, when the direct current power supply 31 is normally connected as shown by solid lines, the body diode D14 of the IGFET 27 of the protective switch control means 13b becomes conductive, the potential of the base B of the pnp transistor Q13 of the protective switch means 12b becomes higher than the potential of the emitter E, thereby keeping the pnp transistor Q13 in an OFF state. In contrast, when the direct current power supply 31 is inversely connected as shown by dotted lines, the reverse blocking diode 24 becomes conductive, the potential of the gate electrode G of the IGFET 27 becomes higher than the source electrode S, thereby making the IGFET 27 to be an ON state. Thereby, a base current of the pnp transistor Q13 flows through the IGFET 27 and the pnp transistor Q13 becomes an ON state. As a result, the main IGFET 11 of the 4th embodiment as shown in FIG. 6 becomes an OFF state as with the main IGFET 11 as shown by the identical reference numeral in FIG. 2, and an inverse current through the IGFET 11 becomes zero or minute. Therefore, even by the 4th embodiment as shown in FIG. 6, similar effects to the 1st embodiment as shown in FIG. 2 can be obtained.

Meanwhile, in FIG. 6, the connection point of the load 30 may be, as with FIG. 4, moved to a midway between the source electrode S of the main IGFET 11 and the second power supply connection conductor 20 and the lower end of the resistor 25 may be connected with the second power supply connection conductor 20.

5th Embodiment

Figure 7:
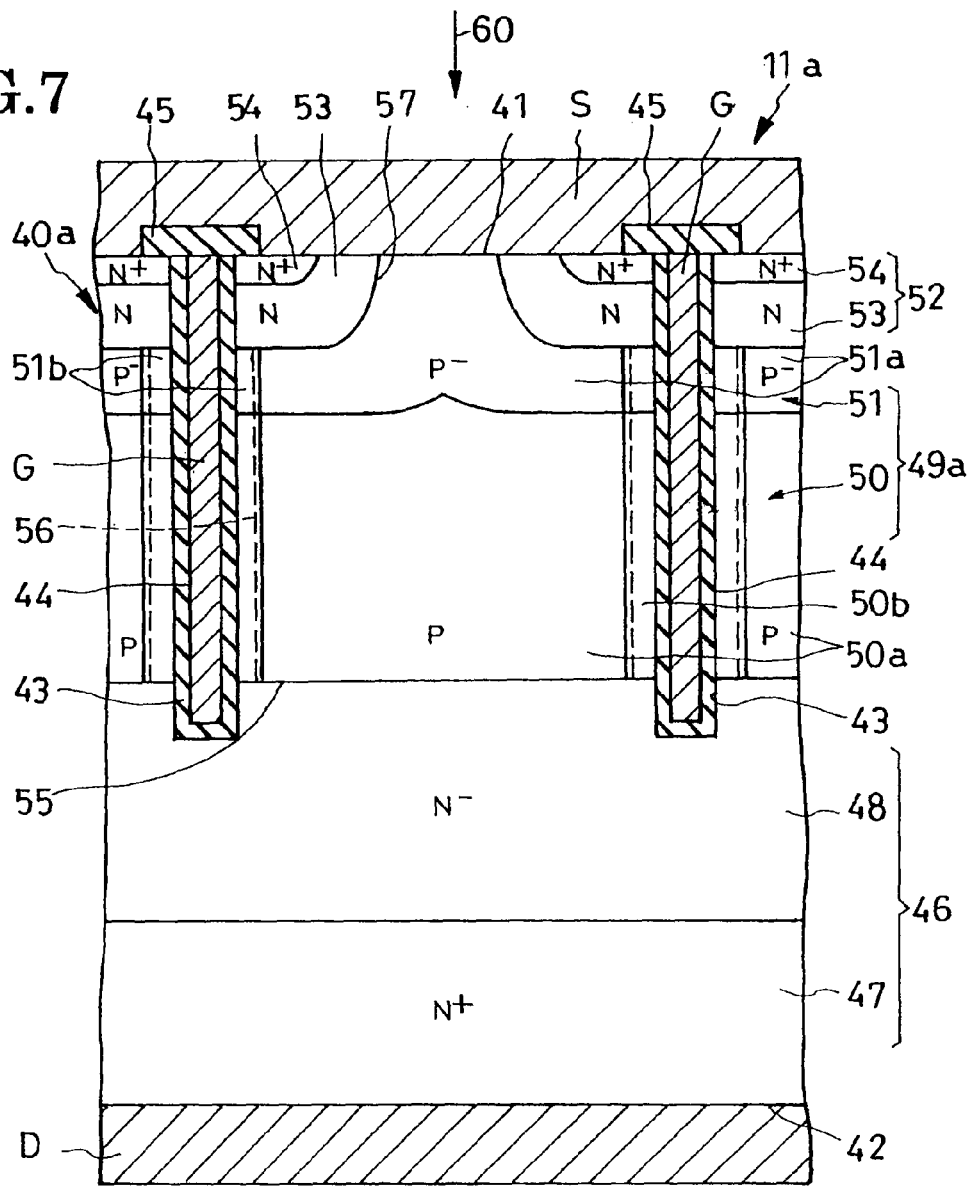
FIG. 7 is a cross sectional view of a main IGFET shown in a way as of FIG. 3, which is used in a switching device according to a 5th embodiment of the present invention.

Shown in FIG. 7 is a main IGFET 11a modified for the purpose of being used instead of the main IGFET 11 of the 1st embodiment as shown in FIG. 2. The main IGFET 11a of FIG. 7 differs from the main IGFET 11 of the 1st embodiment as shown in FIG. 3 in that a second part 50b with a relatively high impurity concentration enclosing a first part 50a at the center of the first body region 50 is provided by implanting a P type impurity along the trenches 43, a second part 51b with a relatively high impurity concentration enclosing a first part 51a at the center of the body region 51, and a body region 49a composed of the first and second body regions 50, 51 is treated with electron beam radiation, but is, in the other points, formed identical to FIG. 3.

The second parts 50b, 51b formed by implanting the P type impurity in the first and second body regions 50, 51 of the main IGFET 11a are to raise the threshold value (threshold voltage Vth) of the main IGFET 11a, and are formed at parts along the trenches 43 of the first and second body regions 50, 51, where the channels 56 are formed, and have a higher impurity concentration than the first parts 50a, 51. In FIG. 7, the second part 50b is so formed as to correspond to the whole length of the channel 56 in the first body region 50, however instead the second part 50b may be formed only at a part in the upper side of the first body region 50 (a part of the channel 56). Further, in FIG. 7, the second part 51b is so formed as to correspond to the whole length of the channel 56 in the second body region 51, however instead the second part 51b may be formed only at a part in a direction where the channel 56 of the second body region 51 extends, or the second part 51b may not be formed in the second body region 51.

The main IGFET 11a with the second parts 50b, 51b with a relatively high impurity concentration have a threshold voltage Vth higher by about 1V than a main IGFET 11 without forming the second parts 50b, 51b, that of FIG. 3 for example. Meanwhile, as the second parts 50b, 5ab are limitedly formed, they do not have much influence on the breakdown voltage and the ON-resistance of the main IGFET 11a.

To the semiconductor substrate 40a of the main IGFET 11a of the 5th embodiment as shown in FIG. 7, an electron beam of 2 MeV for example is radiated via the source electrode S1 as shown by an arrow 60 in FIG. 7, and is thereafter treated with heat treatment at 300 degrees C. or higher in a hydrogen atmosphere. The heat treatment is for recovering damages in interfaces between Si (silicon) and $SiO_2$ (silicon oxide) caused by the electron beam radiation. When the electron beam is radiated, a lifetime of minority carriers in the first and second body regions 50, 51 are shortened. If the lifetime is shortened in such a way, electrons (minority carriers), which are injected from the second drain region 48 of the N– type into the first and second body regions 50, 51 when an inverse voltage is impressed to the main IGFET 11a, rapidly combine with holes, thereby suppressing flow of the electrons (minority carriers) to the first source region 53 of the N type. Thereby, current leakage of the main IGFET 11a decreases and the breakdown voltage of the main IGFET 11a is improved. If the lifetime of the minority carriers in the first and second body regions 50, 51 of the main IGFET 11a is reduced down to 1/10 of the prior IGFETs for example, the breakdown voltage of the main IGFET 11a raises up to 21V, higher than the breakdown voltages (15V) of the prior IGFETs.

Meanwhile, while the whole of the semiconductor substrate 40a is exposed to the electron beam radiation in the 5th embodiment, the radiation may be localized into limited areas. Further, lifetime killers such as gold may be distributed in the first and second body regions 50, 51.

The 5th embodiment provides the effect of raising the threshold voltage Vth of the main IGFET 11a and the effect of shortening of the lifetime as described above, and further provides effects identical to those of the 1st embodiment.

6th Embodiment

Figure 8:
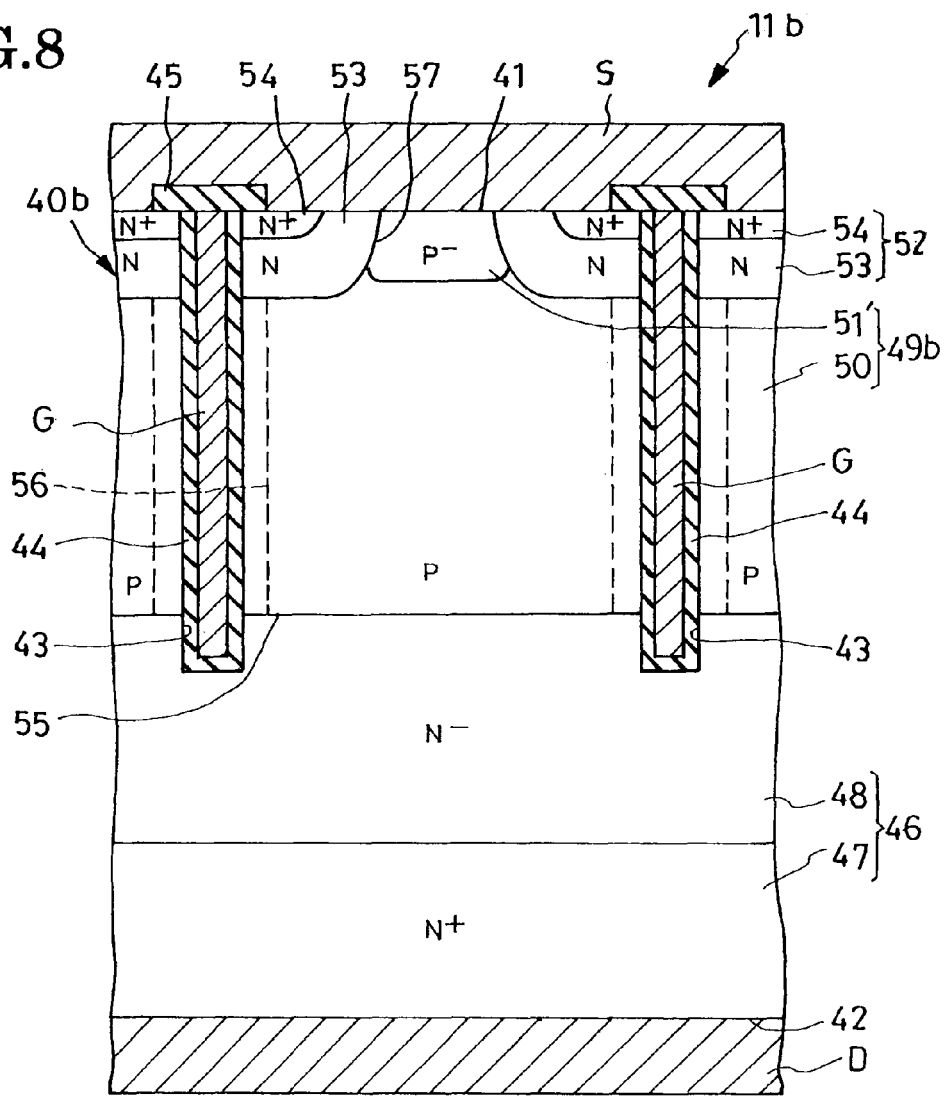
FIG. 8 is a cross sectional view of a main IGFET shown in a way as of FIG. 3, which is used in a switching device according to a 6th embodiment of the present invention.

Shown in FIG. 8 is a main IGFET 11b modified for the purpose of being used instead of the main IGFET 11 of the 1st embodiment as shown in FIG. 2. The modified main IGFET 11b of the 6th embodiment as shown in FIG. 8 is formed identical to the main IGFET 11 of FIG. 3 aside from a point of arrangement of a second body region 51' of a P− type. In FIG. 8, the second body region 51' of the P− type is provided only at a site near a first principal surface 41 of a semiconductor substrate 40b, and is therefore not adjacent to the trenches 43. The second body region 51' of the P− type forms a Schottky barrier diode with accompanying a source electrode S1. Thus even the main IGFET 11b having the limited second body region 51' of the P− type between the paired trenches 43 as shown in FIG. 8 provides effects similar to those of the main IGFET 11 of FIG. 3. Meanwhile it is possible that, in the first body region 50 of the main IGFET 11b of the 6th embodiment of FIG. 8, that corresponding to the second part 50b shown in FIG. 7 is provided, and the semiconductor substrate 40b is exposed to electron beam radiation so as to shorten the lifetime of the minority carriers in the first and second body regions 50, 51'.

7th Embodiment

Figure 9:
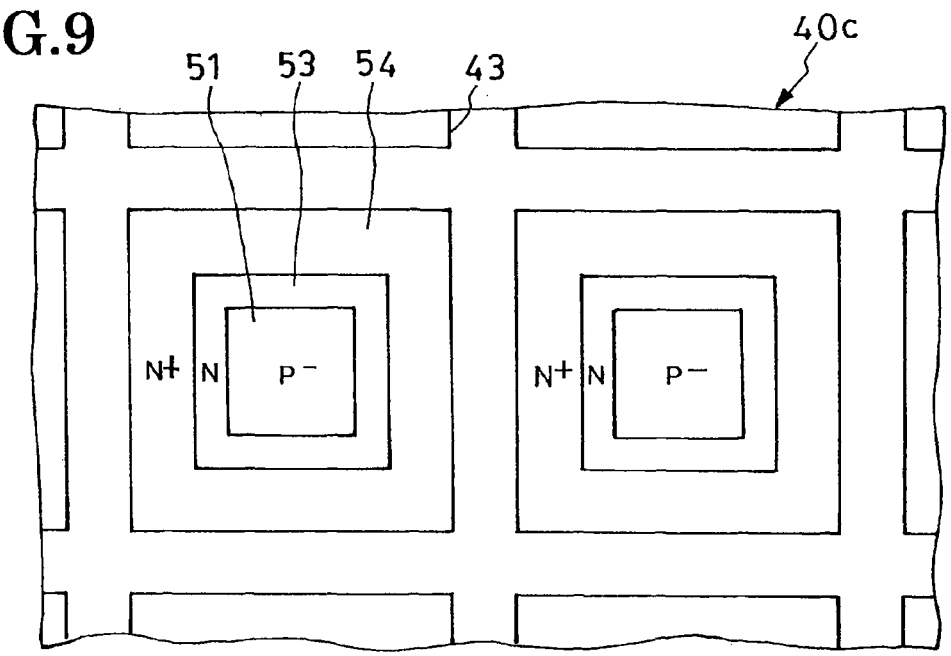
FIG. 9 is a plan view of a part of a semiconductor substrate, which constitutes a main IGFET used in a switching device according to a 7th embodiment of the present invention.

Shown in FIG. 9 is a surface of a semiconductor substrate 40c constituting a modified main IGFET for the purpose of being used instead of the main IGFET 11 of the 1st embodiment shown in FIG. 2. In the semiconductor substrate 40c shown in FIG. 9, the trenches 43 are formed like as lattices, the second body region 51 of the P− type, the first source region 53 of the N type, and the second source region 54 of the N+ type are disposed in the lattice-like trenches 43. The main IGFET having the semiconductor substrate 40c modified in a way as shown in FIG. 9 operates in a similar way to the main IGFET 11 according to the 1st embodiment shown in FIG. 3.

8th Embodiment

Figure 10:
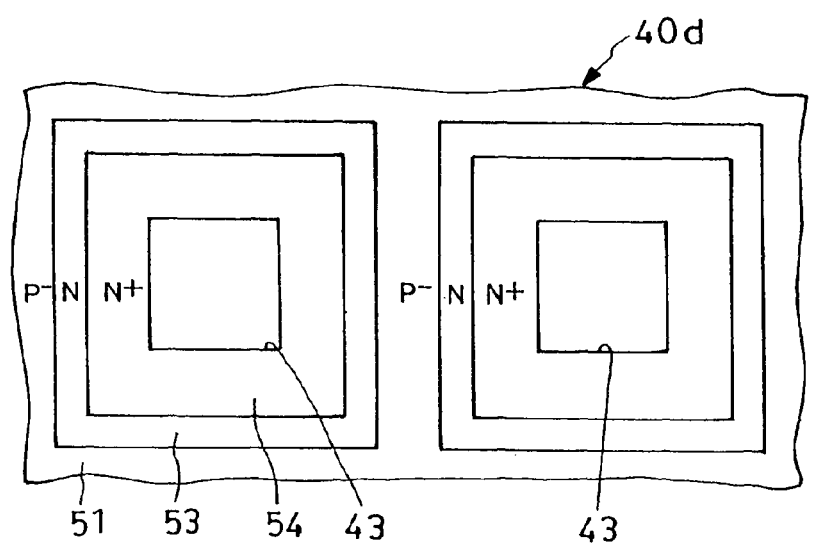
FIG. 10 is a plan view of a part of a semiconductor substrate, which constitutes a main IGFET used in a switching device according to an 8th embodiment of the present invention.

Shown in FIG. 10 is a surface of a semiconductor substrate 40d constituting a modified main IGFET for the purpose of being used instead of the main IGFET 11 of the 1st embodiment shown in FIG. 2. In the semiconductor substrate 40d shown in FIG. 10, the trenches 43 are formed like as columns, the second source region 54 of the N+ type, the first source region 53 of the N type, and the second body region 51 of the P− type are disposed to surround the columnar trenches 43. The main IGFET having the semiconductor substrate 40d modified in a way as shown in FIG. 10 operates in a similar way to the main IGFET 11 according to the 1st embodiment shown in FIG. 3.

9th Embodiment

Figure 11:
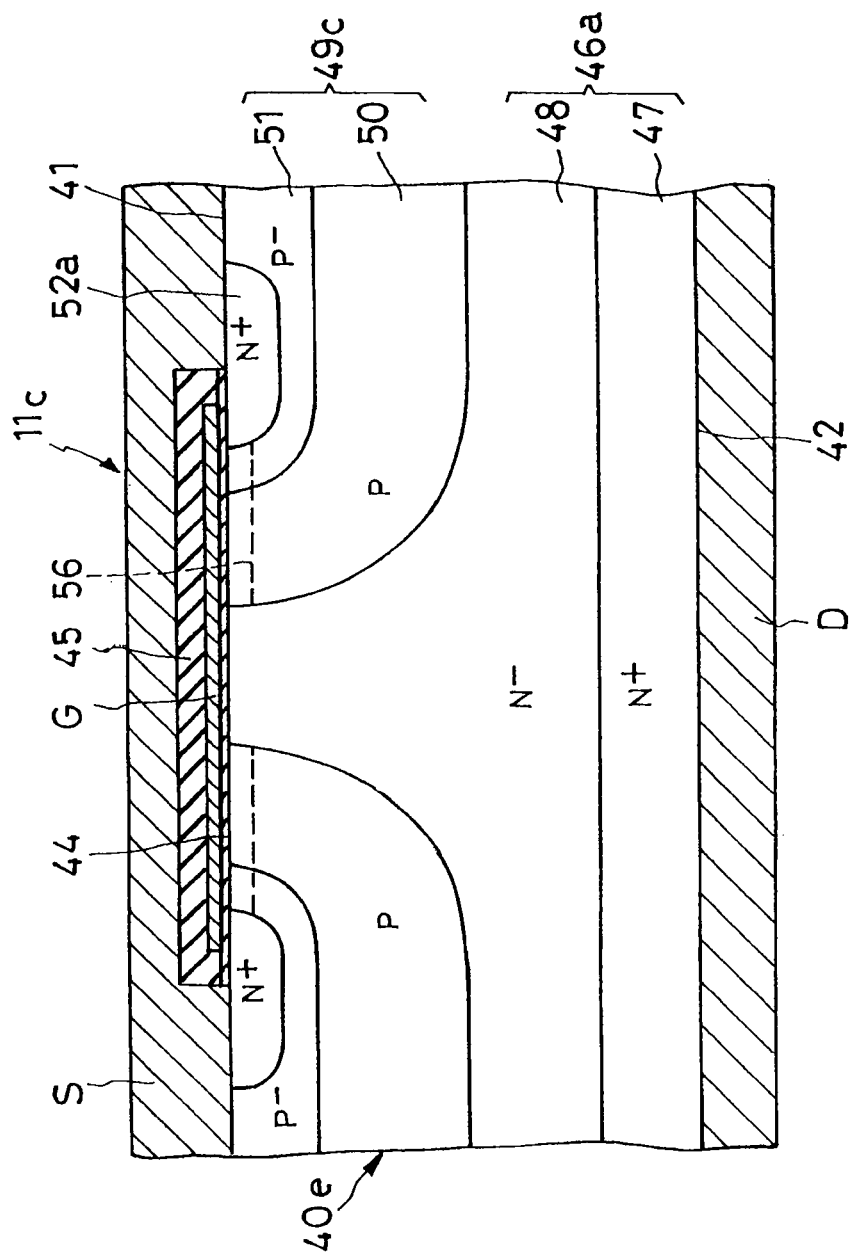
FIG. 11 is a cross sectional view of a main IGFET shown in a way as of FIG. 3, which is used in a switching device according to a 9th embodiment of the present invention.

Shown in FIG. 11 is a main IGFET 11c modified for the purpose of being used instead of the main IGFET 11 of the 1st embodiment shown in FIG. 2. The main IGFET 11c has a planar structure and the gate insulator layer 44 and the gate electrode G are formed on the first principal surface of the semiconductor substrate 40e. Further, a drain region 46a and a body region 49c are exposed on the first principal surface 41 of the semiconductor substrate 40e. The drain region 46a has the first drain region 47 formed of the semiconductor of the N+ type and the second drain region 48 formed of the semiconductor of the N− type as with the 1st embodiment of FIG. 3, and only the second drain region 48 is exposed on the first principal surface 41 of the semiconductor substrate 40e. The body region 49c is composed of the first body region 50 formed of the semiconductor of the P type and the second body region 51 formed of the semiconductor of the P− type, each formed in an island shape in the second drain region 48. The source region 52a is formed in an island shape in the second body region 51. The gate insulator layer 44 is formed on the first principal surface 41 of the semiconductor substrate 40e so as to at least cover the exposed surface of the body region 49c. The gate electrode G is opposed to the exposed surface of the body region 49a with the gate insulator layer 44 interposed therebetween. The source electrode S is in ohmic contact with the source region 52a and in Schottky contact with the second body region 51. Thus an equivalent circuit of the main IGFET 11c according to the 9th embodiment of FIG. 11 can be illustrated in a way similar to the main IGFET 11 of FIG. 2. Even if the main IGFET 14e according to the 9th embodiment is used to constitute the switching device shown in FIG. 2, effects similar to the 1st embodiment can be obtained.

10th Embodiment

Figure 12:
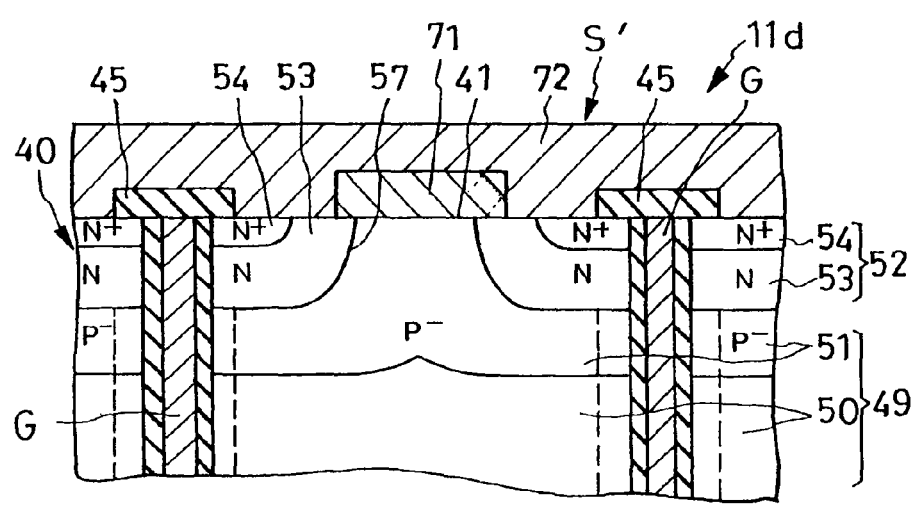
FIG. 12 is a cross sectional view of a main IGFET shown in a way as of FIG. 3, which is used in a switching device according to a 10th embodiment of the present invention.

Shown in FIG. 12 is a part of a main IGFET 11d modified for the purpose of being used instead of the main IGFET 11 of the 1st embodiment shown in FIG. 2. The main IGFET 11d is constituted as identical to the main IGFET 11 of FIG. 3 aside from a point that it has a modified source electrode S'. The modified source electrode S' is constituted of a first metal layer 71 in Schottky contact with the second body region 51 and a second metal layer 72 in ohmic contact with the first and second source regions 53, 54. The first metal layer 71 is electrically connected with the second metal layer 72. Even if the source electrode S' is constituted of the combination of the first and second metal layers 71, 72 in such a way, effects similar to those of the 1st embodiment of FIG. 3 can be obtained.

11th Embodiment

Figure 13:
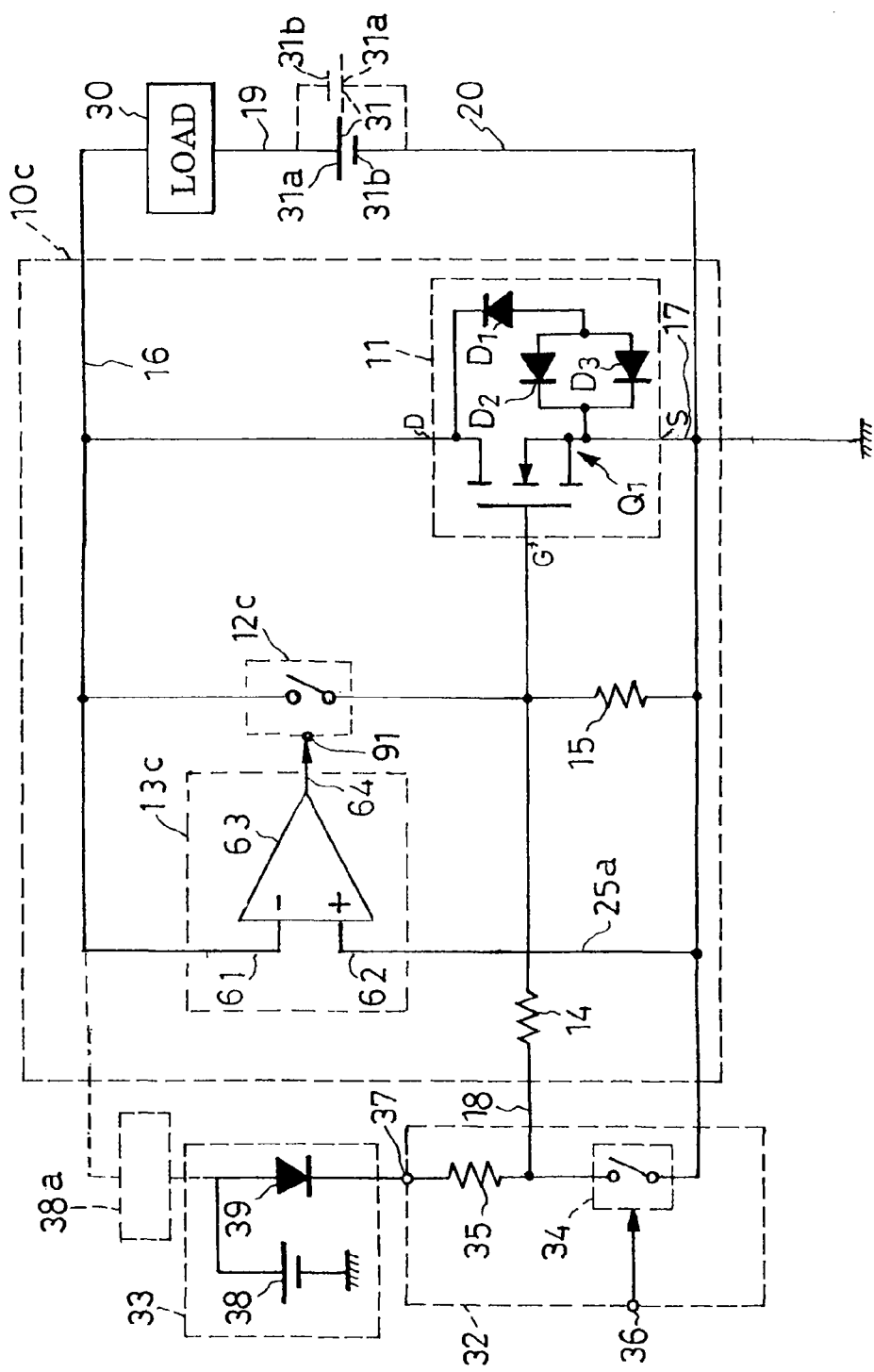
FIG. 13 is a circuit diagram equivalently showing an electric circuit including a switching device according to a 11th embodiment of the present invention.

Shown in FIG. 13 is an electric circuit including a switching device 10c according to the 11th embodiment of the present invention. The electric circuit of FIG. 13 is constituted identical to that of FIG. 2 aside from the switching device 10c. A protective switch means 12c of the switching device 10c shown in principle in FIG. 13 is connected in between the drain electrode D and the gate electrode G of the main IGFET 11 and is ON-driven when an inverse voltage is impressed to the main IGFET 11. More specifically, one end of the protective switch means 12c is connected with the drain electrode D of the main IGFET 11, another end thereof is connected with the gate electrode G of the main IGFET 11, and a control terminal 91 is connected with the protective switch control means 13c. The protective switch means 12c shown in principle can be constituted in a way similar to the protective switch means 12, 12a, 12b of FIG. 2, 5, 6.

The protective switch control means 13c of FIG. 13 is composed of first and second voltage detection conductors 61, 62 as means for detecting a voltage impressed to the main IGFET 11, an inverse voltage detection means 63 for detecting whether an inverse voltage is impressed to the main IGFET 11 or not, and an output conductor 64 as a driving means for driving the protective switch means 12c by output of the inverse voltage detection means 63. One of the input terminals of the inverse voltage detection means 63 constituted of a voltage comparator is connected with the drain electrode of the main IGFET 11 via the first voltage detection conductor 61, another of the input terminals of the inverse voltage detection means 63 is connected with the source electrode S of the main IGFET 11 via the second voltage detection conductor 62, and the output conductor 64 is connected with the control terminal of the protective switch means 12c. In FIG. 13, the output conductor 64 of the inverse voltage detection means 63 is connected with the control terminal 91 of the protective switch means 12c in series, however any drive circuit for driving the protective switch means 12c may be connected in between the inverse voltage detection means 63 and the protective switch means 12c.

When the direct current power supply 31 is normally connected relative to the main IGFET 11, a forward voltage is impressed to the main IGFET 11, the inverse voltage detection means 63 outputs a signal (forward voltage detection signal) indicating that an inverse voltage is not detected, and the protective switch means 12c is kept OFF. When the direct current power supply 31 is abnormally connected relative to the main IGFET 11, an inverse voltage is impressed to the main IGFET 11, and the inverse voltage detection means 63 outputs a signal (inverse voltage detection signal) indicating the inverse voltage. Thereby, the protective switch means 12c is controlled to be ON. As a result, even by the 11th embodiment of FIG. 13, effects similar to the 1st embodiment of FIG. 2 can be obtained.

Meanwhile, in FIG. 13, the connection point of the load 30 may be, as with FIG. 4, moved to a midway between the source electrode S of the main IGFET 11 and the second power supply connection conductor 20 and the second voltage detection conductor 62 may be connected with the second power supply connection conductor 20.

The present invention is not limited to the aforementioned embodiments and any modification such as that described below for example may be possible.

(1) Instead of constituting the switching device 10 of FIG. 2 of a monolithic IC, a circuit identical to FIG. 2 may be constituted of a hybrid IC or individual parts.

(2) Instead of constituting the gate resistor 14 of a diffusion region in the semiconductor substrate, a resistor layer such as a polycrystalline silicon layer may be formed on an insulator layer on the semiconductor substrate, and then this resistor layer may be used as a gate resistor.

Although the invention has been described above by reference to certain embodiments of the invention, the invention is not limited to the embodiments described above. Modifications and variations of the embodiments described above will occur to those skilled in the art, in light of the above teachings.

What is claimed is:

1. A switching device used in an electric circuit, comprising:
a main insulated-gate field-effect transistor comprising a drain region of a first conductive type, a body region of a second conductive type disposed on the drain region and having an exposed surface, a source region of the first conductive type formed in the body region and having an exposed surface, a drain electrode in ohmic contact with the drain region, a source electrode in ohmic contact with the source region and in Schottky contact with the body region, a gate insulator layer formed on an exposed surface of the body region between the source region and the drain region, a gate electrode opposed to the exposed surface of the body region via the gate insulator layer;
a protective switch having a first end connected with the drain electrode of the main insulated-gate field-effect transistor, a second end connected with the gate electrode of the main insulated-gate field-effect transistor, and a control terminal; and
protective switch control connected with the control terminal of the protective switch and having a function to make the protective switch into an on-state when a voltage is impressed in between the drain electrode and the source electrode in a direction to make the Schottky contact in the main insulated-gate field-effect transistor to be inversely biased.

2. The switching device of claim 1, further comprising:
a control signal input conductor through which a control signal for on-off-control of the main insulated-gate field-effect transistor is input, and a resistor connected in between the control signal input conductor and the gate electrode of the main insulated-gate field-effect transistor.

3. The switching device of claim 1, further comprising:
a resistor connected in between the gate electrode and the source electrode of the main insulated-gate field-effect transistor.

4. The switching device of claim 1, wherein the protective switch comprising a first protective insulated-gate field-effect transistor having a drain electrode, a source electrode, and a gate electrode and a body diode, the source electrode being connected with the drain electrode of the main insulated-gate field-effect transistor, and a second protective insulated-gate field-effect transistor having a drain electrode connected with the drain electrode of the first protective insulated-gate field-effect transistor, a source electrode connected with the gate electrode of the main insulated-gate field-effect transistor, a gate electrode and a body diode, the first end of the protective switch is the source electrode of the second protective insulated-gate field-effect transistor, the second end of the protective switch is the source electrode of the second protective insulated-gate field-effect transistor, and the control terminal of the protective switch is the gate electrode of the first protective insulated-gate field-effect transistor and the gate electrode of the second insulated-gate field-effect transistor.

5. The switching device of claim 4, further comprising:
a direct current power supply having a first end and a second end, a first power supply connection conductor for connecting the drain electrode of the main insulated-gate field-effect transistor with the first end of the direct current power supply, and a second power supply connection conductor for connecting the source electrode of the main insulated-gate field-effect transistor with the second end of the direct current power supply, wherein the protective switch control comprises a resistor connected in between the source electrode and the gate electrode of the first protective insulated-gate field-effect transistor, a reverse blocking diode connected in between the gate electrode of the first protective insulated-gate field-effect transistor and the gate electrode of the second protective insulated-gate field-effect transistor, and a conductor for connecting the gate electrode of the second protective insulated-gate field-effect transistor with the second power supply connection conductor.

6. The switching device of claim 5, wherein the protective switch control further comprises a constant voltage diode connected in between the source electrode and the gate electrode of the first protective insulated-gate field-effect transistor.

7. The switching device of claim 1, wherein the protective switch has a drain electrode, a source electrode, a gate electrode and a body diode, and comprises a protective insulated-gate field-effect transistor, the source electrode of the protective insulated-gate field-effect transistor being connected with the drain electrode of the main insulated-gate field-effect transistor, and a reverse blocking diode in between a drain electrode of the protective insulated-gate field-effect transistor and the gate electrode of the main insulated-gate field-effect transistor, the first end of the protective switch is the source electrode of the protective insulated-gate field-effect transistor, the second end of the protective switch is a terminal connected to the gate electrode of the main insulated-gate field-effect transistor, and the control terminal of the protective switch is the gate electrode of the protective insulated-gate field-effect transistor.

8. The switching device of claim 7, further comprising:
a control signal input conductor through which a control signal for on-off-control of the main insulated-gate field-effect transistor is input, and a resistor connected in between the control signal input conductor and the gate electrode of the main insulated-gate field-effect transistor.

9. The switching device of claim 7, further comprising:
a resistor connected in between the gate electrode and the source electrode of the main insulated-gate field-effect transistor.

10. The switching device of claim 9, further comprising:
a direct current power supply having a first end and a second end, a first power supply connection conductor for connecting the drain electrode of the main insulated-gate field-effect transistor with the first end of the direct current power supply, and a second power supply connection conductor for connecting the source electrode of the main insulated-gate field-effect transistor with the second end of the direct current power supply, wherein the protective switch control comprises a resistor connected in between the source electrode and the gate electrode of the first protective insulated-gate field-effect transistor, a reverse blocking diode connected in between the gate electrode of the first protective insulated-gate field-effect transistor and the gate electrode of the second protective insulated-gate field-effect transistor, and a conductor for connecting the gate electrode of the second protective insulated-gate field-effect transistor with the second power supply connection conductor.

11. The switching device of claim 9, wherein the protective switch control further has a constant voltage diode connected in between the source electrode and the gate electrode of the first protective insulated-gate field-effect transistor.

12. The switching device of claim 1, wherein the protective switch comprises a junction type transistor connected in between the drain electrode and the gate electrode of the main insulated-gate field-effect transistor, and the protective switch control comprises a base current supply circuit connected with a base of the junction type transistor so as to supply a base current to make the junction type transistor into an on-state when a voltage is impressed in between the drain electrode and the source electrode of the main insulated-gate field-effect transistor in a direction to make the Schottky contact in the main insulated-gate field-effect transistor to be inversely biased.

13. The switching device of claim 12, wherein the junction type transistor has a collector connected with the drain electrode of the main insulated-gate field-effect transistor and an emitter connected with the gate electrode of the main insulated-gate field-effect transistor.

14. The switching device of claim 13, further comprising:
a direct current power supply having a first end and a second end, a first power supply connection conductor for connecting the drain electrode of the main insulated-gate field-effect transistor with the first end of the direct current power supply, and a second power supply connection conductor for connecting the source electrode of the main insulated-gate field-effect transistor with the second end of the direct current power supply, wherein the base current supply circuit comprises a transistor controlling insulated-gate field-effect transistor having a source electrode connected with the collector of the junction type transistor, a drain electrode connected with the base of the junction type transistor, a gate electrode and a body diode, a resistor connected in between the source electrode and the gate electrode of the transistor controlling insulated-gate field-effect transistor, and a reverse blocking diode connected in between the gate electrode of the transistor controlling insulated-gate field-effect transistor and the second power supply connection conductor.

15. The switching device of claim 14, wherein the base current supply circuit further comprises a second resistor connected in series with the reverse blocking diode.

16. The switching device of claim 14, wherein the base current supply circuit further has a constant voltage diode connected in between the source electrode and the gate electrode of the transistor controlling insulated-gate field-effect transistor.

17. The switching device of claim 1, wherein the protective switch control comprises inverse voltage detection means for detecting whether an inverse voltage is impressed in between the drain electrode and the source electrode of the main insulated-gate field-effect transistor in a direction to make the Schottky contact in the main insulated-gate field-effect transistor to be inversely biased, and drive means for on-driving the protective switch in response to a signal indicating the inverse voltage obtained by the inverse voltage detection means, and the drive means is connected with the control terminal of the protective switch.

* * * * *